United States Patent
Daigo et al.

(10) Patent No.: US 9,812,944 B2
(45) Date of Patent: Nov. 7, 2017

(54) DISCHARGE DEVICE

(71) Applicant: Mitsubishi Electric Corporation, Tokyo (JP)

(72) Inventors: Toru Daigo, Tokyo (JP); Taisuke Iwakiri, Tokyo (JP); Takuya Miyanaga, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 132 days.

(21) Appl. No.: 14/840,161

(22) Filed: Aug. 31, 2015

(65) Prior Publication Data

US 2016/0344217 A1    Nov. 24, 2016

(30) Foreign Application Priority Data

May 19, 2015 (JP) .................. 2015-101683

(51) Int. Cl.
*H02J 17/00* (2006.01)
*H02M 1/32* (2007.01)
(Continued)

(52) U.S. Cl.
CPC .......... *H02M 1/32* (2013.01); *H03K 17/0822* (2013.01); *H03K 17/0828* (2013.01);
(Continued)

(58) Field of Classification Search
USPC ....................................................... 320/166
See application file for complete search history.

(56) References Cited

U.S. PATENT DOCUMENTS

2004/0196669 A1* 10/2004 Thrap ................ H02M 1/4258
363/19
2005/0253458 A1* 11/2005 Omae ..................... H01M 6/36
307/10.1
(Continued)

FOREIGN PATENT DOCUMENTS

DE     102007002544 A1    8/2007
JP     2003-348856 A     12/2003
(Continued)

OTHER PUBLICATIONS

Communication dated Jan. 5, 2016 from the Japanese Patent Office in counterpart application No. 2015-101683.
(Continued)

*Primary Examiner* — Mohammed Alam
(74) *Attorney, Agent, or Firm* — Sughrue Mion, PLLC; Richard C. Turner

(57) ABSTRACT

A discharge device includes a switch element connected in parallel to an electrical storage element; a constant current output unit which supplies a constant current to the switch element; and a control unit which gives an on or off instruction to the constant current output unit, wherein a configuration is such that the control unit controls the constant current output unit so as to cause energy with which is charged in the electrical storage element to be discharged while being consumed by the switch element, and within an optional time for which an energization current of the switch element reaches a limiting current of the switch element, turn off the switch element in a region in which the energization current is lower than the limiting current.

13 Claims, 7 Drawing Sheets

(51) Int. Cl.
   *H03K 17/082*  (2006.01)
   *H03K 17/08*  (2006.01)

(52) U.S. Cl.
   CPC .......... *H02M 2001/322* (2013.01); *H03K 2017/0806* (2013.01)

(56) References Cited

U.S. PATENT DOCUMENTS

| | | | |
|---|---|---|---|
| 2007/0200613 A1* | 8/2007 | Ishikawa | H03K 17/168 327/427 |
| 2010/0025126 A1 | 2/2010 | Nakatsu et al. | |
| 2012/0275205 A1 | 11/2012 | Nakatsu et al. | |
| 2013/0063098 A1* | 3/2013 | Knowlton | H02J 7/0091 320/137 |
| 2013/0128645 A1 | 5/2013 | Nakatsu et al. | |
| 2014/0307495 A1 | 10/2014 | Fukuta et al. | |
| 2015/0022974 A1 | 1/2015 | Nakatsu et al. | |
| 2015/0028923 A1 | 1/2015 | Peng et al. | |
| 2015/0289391 A1 | 10/2015 | Nakatsu et al. | |
| 2016/0329733 A1* | 11/2016 | Daigo | H02J 7/0072 |

FOREIGN PATENT DOCUMENTS

| | | |
|---|---|---|
| JP | 2009-232620 A | 10/2009 |
| JP | 2011-182578 A | 9/2011 |
| JP | 2012050224 A | 3/2012 |
| JP | 2012060765 A | 3/2012 |
| JP | 2013-51882 A | 3/2013 |
| JP | 2013-55753 A | 3/2013 |
| JP | 2014-140280 A | 7/2014 |
| JP | 2014-207620 A | 10/2014 |
| WO | 2013/138219 A1 | 9/2013 |

OTHER PUBLICATIONS

Wolfgang Frank et al.,"Real-time adjustable gate current control IC solves dv/dt problems in electric drives", PCIM Europe 2014, May 20-22, 2014, Nuremberg, Germany, pp. 98-104, 8 pages total.

Communication dated Mar. 4, 2016 from the German Patent Office issued in corresponding Application No. 102015219683.6.

Communication dated Jun. 7, 2016, from the Japanese Patent Office in counterpart application No. 2015-101683.

* cited by examiner

US 9,812,944 B2

DISCHARGE DEVICE

BACKGROUND OF THE INVENTION

Field of the Invention

The present invention relates to a discharge device which discharge power stored in an electrical storage element, and in particular to a discharge device which, using a control signal, drives a switch element connected in parallel to the electrical storage element.

Description of the Related Art

An inverter, or the like, which controls a motor, by controlling a switching device, switches a current supply path through which to cause current to flow to each coil of the motor from a power supply, thus carrying out a drive control of the motor. Also, a transformer, or the like, by controlling the switching device, adjusts the amount of current supplied to a reactor (a coil) from the power supply, and transforms a voltage generated in the power supply into an optional voltage, thus carrying out an output of the voltage.

As a specific configuration of the switching device, there is one wherein a first switch element and a second switch element are connected in series, and the connection point of the first switch element and second switch element is connected to the motor or reactor as an output portion. Further, an electrical storage element (generally, a capacitor) which smooths a power fluctuation is provided in connection with the first switch element and second switch element connected in series. Further, when disconnecting wires from the motor and inverter in order to maintain, overhaul, and repair the inverter and motor after the operation of the inverter or the like is over, working efficiency is low when electric charge is stored in the electrical storage element of an inverter input stage, meaning that it is necessary to discharge energy (electric charge) with which the electrical storage element is charged.

In order to discharge the electric charge of the electrical storage element, attention is focused on an energization loss due to the internal resistance of a switch element, and it is proposed in Patent Document 1 that a first switch element and a second switch element are connected in series, and that the first switch element is connected to the positive terminal side of the electrical storage element, while the second switch element is connected to the negative terminal side of the electrical storage element, so that the first switch element and second switch element connected in series are connected in parallel to the electrical storage element, and the two electrodes of the electrical storage element are short-circuited by repeating an on-state of the switch elements at the same time for a very short time, thus discharging the electric charge of the electrical storage element by only switching operation of the switch elements included in advance.

However, when current flows through a switch element, a loss occurs due to the integration of a voltage applied to the switch element and a current flowing through the switch element, and electric charge stored in the electrical storage element can be discharged, but when an energization current of the switch element increases, the loss of the switch element increases, and the amount of heat generation also increases. Because of this, when the energization current of the switch element increases excessively when discharging, the loss and heat generation of the switch element increase, leading to a thermal destruction of the switch element at the worst.

Consequently, when discharging the electric charge of the electrical storage element, the discharge device has to suppress the energization current of the switch element and avoid the switch element resulting in a thermal destruction.

For example, in the discharge device described in Patent Document 1, when carrying out discharge, the energization current of the switch element is prevented from becoming an overcurrent by defining an on-time (a current rise time) of a drive signal of the switch element and turning off the switch element in a region in which the energization current of the switch element is lower than a limiting current Icmax. Further, turning on and off of the switch element is carried out a plurality of times until the electrical storage element is discharged, and the energization current of the switch element is suppressed, thus avoiding the switch element resulting in a thermal destruction.

Also, in an embodiment of the discharge device described in Patent Document 1, it is possible to suppress the energization current of the switch element by supplying a switch element drive voltage in a region (a current saturation region) in which the energization current of the switch element is lower than the limiting current Icmax (that is, by carrying out a reduction in the switch element drive voltage and supplying the reduced drive voltage), during a discharge control time, compared with during a normal time. Consequently, when discharging the electrical storage element, the energization current of the switch element is suppressed, thus avoiding the switch element resulting in a thermal destruction.

[Patent Document 1] JP-A-2009-232620

However, in the discharge device proposed in Patent Document 1, the on-time (current rise time) of the drive signal of the switch element is defined during the discharge control time, but a rise of current occurs for the on-time of the drive signal of the switch element. That is, when the on-voltage threshold value of the switch element or more is reached upon receiving an on-instruction by the drive signal, current starts to flow through the switch element, and the current increases throughout the on-time. Further, the switch element is turned off by the drive signal in a region in which the energization current of the switch element is lower than the limiting current Icmax.

In Patent Document 1, a voltage drive type switch element (for example, a MOSFET or an IGBT) is shown, and in this case, an on-time (a current rise time) tr can be expressed by Equation 1, wherein Rg is a switch element input resistance, Ciss is a switch element input capacitance, Vg is a switch element drive voltage, Vth is a switch element on-voltage threshold value, Ic is a switch element energization current, and gm is a switch element transmission coefficient, and by inputting an optional current value into Ic, it is possible to obtain the current rise time tr.

$$t_r = -R_{g\times} \times C_{iss} \times \ln\left(1 - \frac{1}{V_g - V_{th}}\sqrt{\frac{I_c}{g_m}}\right) \quad \text{Equation 1}$$

The feature of the voltage drive type switch element is that the energization current of the switch element is saturated at a certain current value in a region in which the switch element drive voltage is low. That is, in the region in which the switch element drive voltage is low, an optional switch element drive voltage can be suppressed to an optional energization current of the switch element. Because of this, in the discharge device of Patent Document 1, the switch element drive voltage is controlled to the optional switch element drive voltage so as to be lower than the value of a switch element drive voltage applied in normal operation so as to obtain the optional energization current of the switch element.

Meanwhile, in general, the on-voltage threshold value and the switch element drive voltage vary due to difference among individual switch elements and to variability among parts of a switch element drive voltage supply circuit.

Because of this, in the discharge device of Patent Document 1, when the preset switch element on-voltage threshold value Vth is large, or when the switch element drive voltage Vg is small, the defined on-time tr increases, and the energization current of the switch element becomes larger than a supposed switch element energization current. As a result, when the on-voltage threshold value Vth and the switch element drive voltage Vg vary, the switch element energization current cannot be suppressed when discharging the electrical storage element, thus causing the problem that the switch element is heated to a temperature higher than expected.

Also, in the case of setting the switch element drive voltage Vg to be low due to the previously described variation, when the on-voltage threshold value Vth is high, and the switch element drive voltage Vg is much lower than the optionally set switch element drive voltage Vg, the on-voltage threshold value Vth>the switch element drive voltage Vg, and there is also a possibility that the switch element is not driven, thus disabling discharge.

SUMMARY OF THE INVENTION

The invention, having been contrived in order to solve the previously described problems, has for its object to provide a discharge device wherein the two electrodes of an electrical storage element are short-circuited by a switch element connected between the two electrodes of the electrical storage element, and when discharging the electrical storage element, a temperature rise due to a loss of the switch element resulting from variation in an on-voltage threshold value of the switch element and in a switch element drive voltage is suppressed, thus reliably carrying out the discharge.

The discharge device according to the invention includes a switch element connected in parallel to an electrical storage element; a constant current output unit which supplies a constant current to the switch element; and a control unit which gives an on or off instruction to the constant current output unit. The control unit controls the constant current output unit so as to cause energy with which is charged the electrical storage element to be discharged while being consumed by the switch element, and within an optional time for which an energization current of the switch element reaches a limiting current of the switch element, turn off the switch element in a region in which the energization current is lower than the limiting current.

According to the discharge device of the invention, by adopting a method whereby an on-time of a control signal of the switch element is defined so as to cause the energy with which is charged the electrical storage element to be discharged while being consumed by the switch element, and so as to turn off the switch element in a region in which the current of the switch element is lower than a limiting current Icmax of the switch element energization current, and the constant current output unit turns on the switch element by outputting a constant current to the drive terminal of the switch element until a switch element maximum drive voltage is reached, while the switch element is driven while the switch element energization current is being increased by an amount equivalent to the defined on-time, thus carrying out on and off control when discharging the electrical storage element, it is possible, even when an on-voltage threshold value of the switch element and a switch element drive voltage vary, to energize the switch element for only the defined on-time, and reliably discharge the energy stored in the electrical storage element while suppressing a temperature rise due to a loss of the switch element resulting from variation in the on-voltage threshold value of the switch element and in the switch element drive voltage.

The foregoing and other objects, features, aspects, and advantages of the present invention will become more apparent from the following detailed description of the present invention when taken in conjunction with the accompanying drawings.

DETAILED DESCRIPTION OF THE PREFERRED EMBODIMENTS

Figure 1:
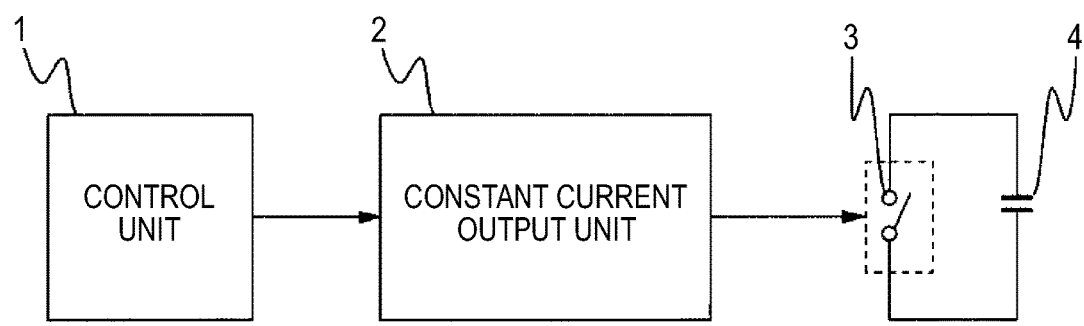
FIG. 1 is a circuit diagram illustrating an example of a discharge device according to a first embodiment of the invention.

Hereafter, a description will be given, referring to the drawings, of preferred embodiments of a discharge device according to the invention. In the drawings, identical signs are given to identical or equivalent portions.

First Embodiment

FIG. 1 is a circuit diagram showing an example of a discharge device according to a first embodiment of the invention. The discharge device in the first embodiment is configured of a control unit 1, a constant current output unit 2, and a switch element 3 in connection with an electrical storage element 4.

As shown in FIG. 1, the electrical storage element 4 and the switch element 3 are connected in parallel. The constant current output unit 2 outputs a constant current to the switch element 3, and the control unit 1 outputs a control signal for on or off control to the constant current output unit 2.

This kind of circuit configuration is premised on the following conditions.
1. The electrical storage element 4 is in a condition in which it is charged with energy.
2. The constant current output unit 2 has received the control signal from the control unit 1 and has not output the current.

3. The switch element 3 is in off-state because there is no current output from the constant current output unit 2.

The discharge device in the first embodiment executes a discharge process through Step 1 to Step 3 to be shown below.

Step 1

Firstly, the control unit 1 outputs the on-control signal to the constant current output unit 2.

The on-time of the control signal at this time is set so that a current flowing through the switch element 3 is equal to or less than a limiting current Icmax of the switch element 3.

For example, an on-time (a current rise time) tr of the switch element 3 can be expressed by Equation 2, wherein Ciss is the input capacitance of the switch element 3, Ig is the drive current of the switch element 3, Ic is the energization current of the switch element 3, and gm is the transmission coefficient of the switch element 3, and tr can be obtained by inputting the value of the energization current Ic. Also, the drive current Ig is also the output of the constant current output unit 2. Consequently, the output current set value of the constant current output unit 2 is set so that the on-time tr is a time for which the control unit 1 is controllable, due to a restriction on the control unit 1, and that the energization current Ic is equal to or less than the limiting current Icmax of the switch element 3, due to a restriction on the switch element 3. That is, the drive current Ig of the switch element 3 is controlled by the constant current output unit 2, thus controlling the energization current rise speed (the amount of current per hour) of the switch element 3, eventually enabling the control within an optional time needed until the energization current Ic flowing through the switch element 3 reaches the limiting current Icmax.

$$t_r = \frac{C_{iss}}{I_g} \sqrt{\frac{I_c}{g_m}}$$ Equation 2

The limiting current Icmax is a current at which, for example, a limiting temperature Tjmax (for example, the limiting temperature of a junction temperature) of the switch element 3 is reached. A junction temperature Tj of the switch element 3 can be obtained by Equation 3 by using a coolant-junction thermal resistance Rth of the switch element 3, a voltage Vce across the switch element 3, the current Ic flowing through the switch element 3, and a coolant temperature To for cooling the switch element 3.

$$T_j = R_{th} \cdot V_{ce} \cdot I_c - T_0$$ Equation 3

The limiting current Icmax of the switch element 3 is obtained when a maximum junction temperature Tjmax of the switch element 3 is determined from Equation 3. Also, the voltage Vce across the switch element 3 is determined by the voltage across the electrical storage element 4 when the switch element 3 is not energized, while the voltage Vce is determined by the element characteristics of the switch element 3 responding to the energization current of the switch element 3 when the switch element 3 is energized.

Consequently, the control unit 1 outputs the on-control signal to the constant current output unit 2 for only the current rise time tr. Further, the constant current output unit 2 outputs the drive current of the switch element 3 until the maximum drive voltage of the switch element 3 is reached, and when the drive voltage of the switch element 3 is higher than an on-voltage threshold value, by turning on the switch element 3, the electrical storage element 4 is brought into a short circuit condition and discharged. At this time, the current flowing through the switch element 3 increases for the time tr or less for which the on-control signal is being output from the control unit 1. Also, the current Ic flowing through the switch element 3, as it is set to be equal to or less than the limiting current Icmax of the switching element 3, will never exceed the limiting current Icmax of the switch element 3.

Step 2

Next, the control unit 1 outputs the off-signal to the constant current output unit 2 when the current rise time tr is reached. The constant current output unit 2 receives the control signal from the control unit 1 and stops the current output to the switch element 3. As there is no more current output from the constant current output unit 2, the drive voltage of the switch element 3 becomes lower than the on-voltage threshold value, and the switch element 3 is turned off, thus stopping the discharge of the electrical storage element 4.

At this time, even though the switch element 3 is energized for the next current rise time tr, the control unit 1 continues turning off the switch element 3 for the time for which the current flowing through the switch element 3 is lower than the limiting current Icmax of the switch element 3.

Step 3

By repeating Step 1 and Step 2, it is possible to discharge the energy with which the electrical storage element 4 is charged.

In Step 1, when it is supposed that the switch element 3 is driven by the constant current output unit 2, no on-voltage threshold value Vth or switch element drive voltage Vg is included in the formula for computation of the current rise time tr, meaning that it is possible to provide a stable current rise time tr regardless of the on-voltage threshold value Vth and switch element drive voltage Vg.

In this way, it is possible to obtain a discharge device which, even though the on-voltage threshold value and switch element drive voltage of the switch element 3 vary, can energize the switch element 3 for only the defined on-time and reliably discharge the energy stored in the electrical storage element 4 while suppressing a temperature rise due to a loss of the switch element 3 resulting from variation in the on-voltage threshold value of the switch element and in the switch element drive voltage.

Also, in the previous description, the current rise time tr shown in Equation 2 is used as the on-time of the switch element 3, but a gate charge time t may be used. The details will be described hereafter.

The gate charge time t can be shown, as in Equation 4, using the relationship between an input current Ig (=the output current of the constant current output unit 2) and gate charge quantity Qg of the switch element 3.

$$Q_g = I_g \cdot t$$ Equation 4

Next, a description will be given of the voltage-type switch element drive voltage Vg, the on-voltage threshold value Vth of the switch element, the gate charge quantity Qg of the switch element, and a gate charge quantity threshold value Qgth of the switch element.

Figure 2:
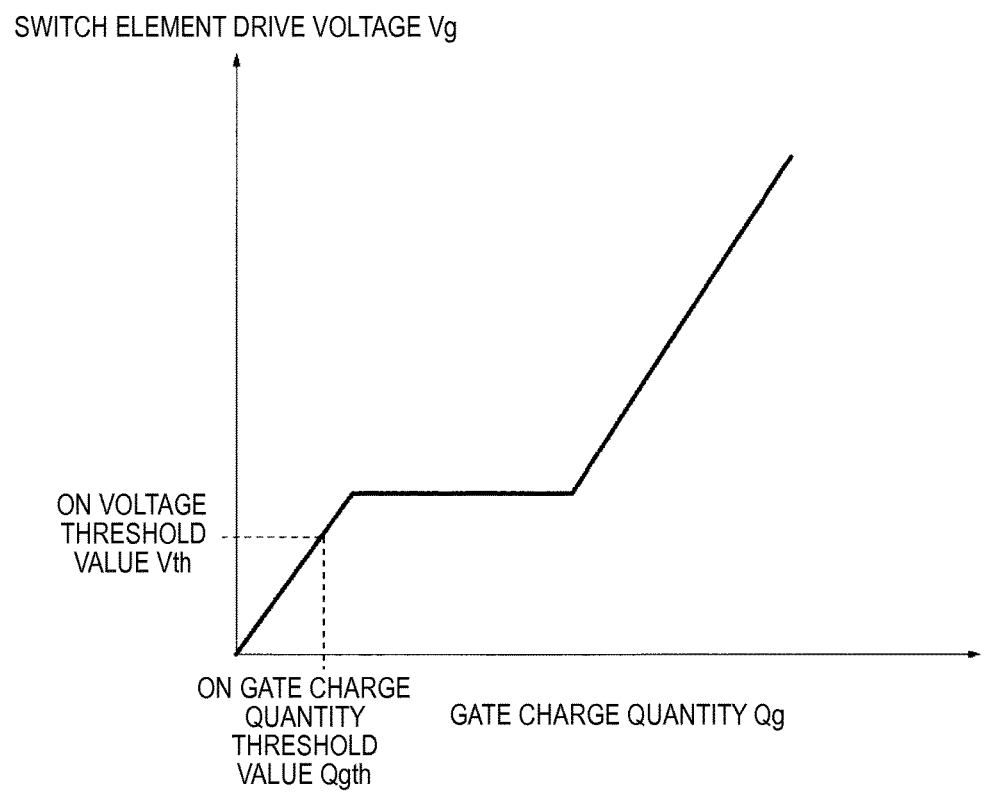
FIG. 2 is a diagram showing a relationship of a switch element drive voltage Vg with a gate charge quantity Qg of a switch element.

FIG. 2 is a diagram showing a relationship of the switch element drive voltage Vg with the gate charge quantity Qg of the switch element according to the first embodiment of the invention. In FIG. 2, the horizontal axis shows the gate charge quantity Qg of the switch element, and the vertical axis shows the switch element drive voltage Vg.

As shown in FIG. 2, when the switch element drive voltage Vg increases, the gate charge quantity Qg also increases accordingly, and when the switch element drive voltage Vg decreases, the gate charge quantity Qg also decreases accordingly. Also, the gate charge quantity threshold value Qgth or more, equivalent to the on-voltage threshold value Vth, is required in order for the switch element 3 to operate.

Further, according to Equation 4, as the gate charge quantity threshold value Qgth is reached when the gate charge time t elapses, and the on-voltage threshold value Vth is definitely reached, regardless of the input current Ig (except Ig=0A) of the switch element 3, it is possible to drive the switch element 3.

This means that it is possible to reliably drive the switch element 3 as long as the gate charge time t elapses regardless of even when the on-voltage threshold value Vth varies (the gate charge threshold value Qgth varies) due to variability among the switch elements 3.

The control unit 1, while it is outputting the on-control signal to the constant current output unit 2, causes the constant current output unit 2 to turn on the switch element 3 until the maximum drive voltage of the switch element 3 is reached, and causes the electrical storage element 4 to be brought into a short circuit condition and discharged, thus enabling the energy with which is charged the electrical storage element 4 to be discharged.

Also, the input current Ig of the switch element 3 (=the output current of the constant current output unit 2) is set so as to reach the limiting current Icmax of the switch element 3 for the gate charge time t.

As the on-voltage threshold value Vth or more is required in order for the switch element 3 to be turned on (energized), a time definitely longer than the gate charge time t defined by the gate charge quantity threshold value Qgth is needed in order for the current of the switch element 3 to reach the limiting current Icmax of the switch element 3 which is the energization current of the switch element 3, meaning that it is possible to reliably drive the switch element 3 for a time needed until the current of the switch element 3 reaches the limiting current Icmax of the switch element 3.

In this way, it is possible to obtain a discharge device which, even though the on-voltage threshold value Vth of the switch element 3 and the switch element drive voltage Vg vary, can reliably discharge the energy stored in the electrical storage element 4 while controlling the output current Ig from the constant current output unit 2 so that the output current Ig reaches the limiting current Icmax of the switch element 3 for the gate charge time t and, when the gate charge time t elapses, suppressing a temperature rise due to a loss of the switch element 3 resulting from variation in the on-voltage threshold value of the switch element 3 and in the switch element drive voltage.

Also, apart from the previously described advantageous effects, it is possible to obtain the advantageous effect that as the time needed until the current of the switch element 3 reaches the limiting current Icmax of the switch element 3 can be controlled as an optional time, it is possible to discharge the energy from the electrical storage element 4 even when the control unit has a low computing power.

The details will be described hereafter.

Firstly, a description will be given of a relationship between the switch element drive voltage Vg and the input current Ig of the switch element 3. The input current Ig can be expressed by Equation 5 by using the on-voltage threshold value Vth of the switch element 3 and the switch element input resistance Rg.

$$I_g = \frac{V_g - V_{th}}{R_g} \quad \text{Equation 5}$$

In order for the switch element 3 to be driven, it is required to set the switch element drive voltage Vg equal to or more than the on-voltage threshold value Vth of the switch element 3, but eventually, the input current Ig of the switch element 3 is generated, as shown in Equation 5, so as to obtain an on-gate charge quantity Qg shown in Equation 4, and the relationship between the switch element drive voltage Vg and the gate charge quantity Qg is as shown in FIG. 2, meaning that an on-gate charge quantity threshold value Qgth or more is obtained.

That is, the switch element 3 is controlled on and off by the gate charge quantity Qg. Also, when the input current Ig of the switch element 3 is low, as previously described, it is possible to suppress a steep rise of the current.

With a discharge device described in Patent Document 1, as it is not possible to drive the switch element 3 unless the relationship between the switch element drive voltage Vg and the on-voltage threshold value Vth of the switch element is the switch element drive voltage Vg>the on-voltage threshold value Vth, it is necessary to make the switch element drive voltage Vg larger than the on-voltage threshold value Vth of the switch element 3. This means that when the on-voltage threshold value Vth of the switch element is large due to variability among the switch elements, it is inevitable to increase the switch element drive voltage Vg. That is, it is required to increase the input current Ig of the switch element 3. When the input current Ig of the switch element 3 is large, it is necessary to shorten the gate charge time t, and consequently, due to the limitation on the switch element drive voltage Vg, there is a limitation on the maximum value of a time (=the gate charge time t) needed until the limiting current value of the switch element 3 is reached.

Meanwhile, in the invention, as the input current Ig of the switch element 3 is directly controlled by the constant current output unit 2, it is possible to optionally control a time (=the gate charge time t) needed until the input current Ig reaches the limiting current Icmax of the switch element 3.

Also, when the switch element 3 is short-circuited, the energization current value of the switch element 3 becomes very large for a short time. Thus, it is hoped to shorten the time (=the gate charge time t) for which to energize the switch element 3, but when the control unit 1 has a low computing power, the switch element 3 is not turned off on time, leading also to the possibility of the limiting current Icmax of the switch element 3 being exceeded.

However, in the first embodiment of the invention, as it is possible to optionally determine the time for which the current flowing through the switch element 3 rises (=the gate charge time t), it is possible to discharge the electrical storage element 4 even when the control unit 1 has a low computing power.

In the previous description, the gate charge time t is set as the time for which the output current Ig from the constant current output unit 2 is adjusted to reach the limiting current Icmax of the switch element 3, but as the energization current of the switch element 3 has only to be equal to or less than the limiting current Icmax, the output current Ig from the constant current output unit 2 may be limited so that the energization current Ic of the switch element 3 is optional for the gate charge time t.

In this case, it is possible to obtain a discharge device which can reliably discharge the energy stored in the electrical storage element 4 while suppressing a temperature rise without making a loss of the switch element 3 excessively larger than in the previously described embodiment.

Also, the previously described first embodiment shows an example of using no discharge resistor, but by connecting a discharge resistor (not shown) in parallel to the electrical storage element 4, the electrical storage element 4 may be efficiently discharged in combination with the discharge resistor.

The temperature information of the switch element 3 may be used for the on-time of the control signal of the control unit 1 of the first embodiment.

Figure 3:
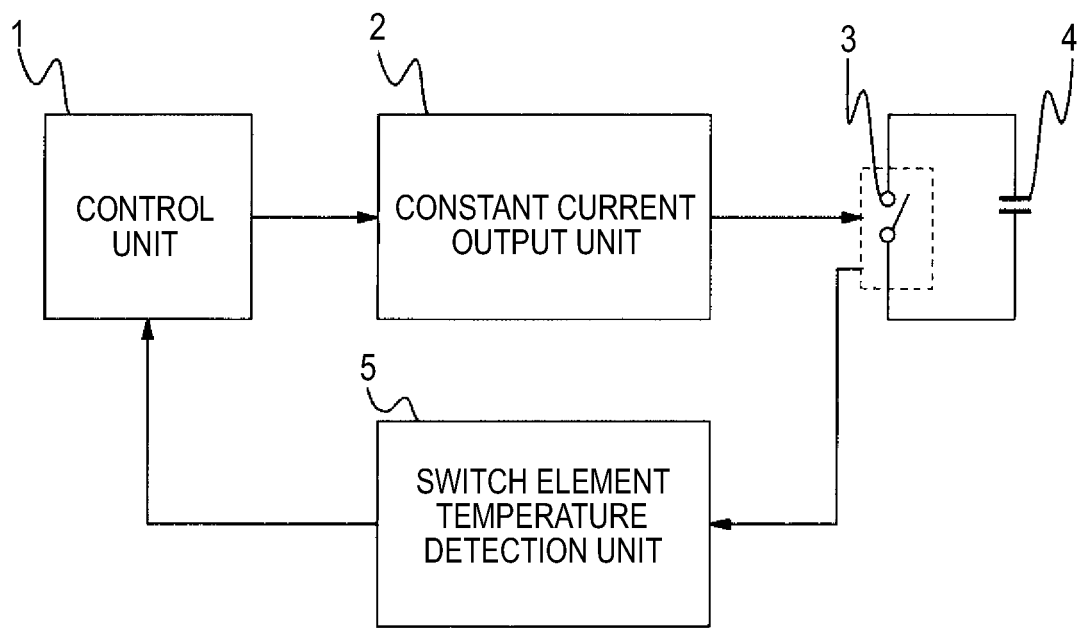
FIG. 3 is a circuit diagram illustrating another example of the discharge device according to the first embodiment of the invention.

FIG. 3 is a circuit diagram illustrating another example of the discharge device according to the first embodiment of the invention. The configuration shown in FIG. 3 is different, when compared with the previous configuration shown in FIG. 1, in including a switch element temperature detection unit 5 which detects the temperature of the switch element 3 and outputs the detected temperature of the switch element 3 to the control unit 1. Thus, hereafter, a description will be given centered on an operation of the switch element temperature detection unit 5 which is the difference.

Step 1

The switch element temperature of the switch element 3 is detected by the switch element temperature detection unit 5.

Step 2

The control unit 1 determines whether or not the switch element temperature detected by the switch element temperature detection unit 5 is the limiting temperature of the switch element 3 (for example, the junction limiting temperature Tjmax of the switch element 3).

At this time, when the switch element temperature is not the limiting temperature of the switch element 3, the control signal is turned to on and output to the constant current output unit 2.

When the switch element temperature is the limiting temperature of the switch element 3, the control signal is turned off and output to the constant current output unit 2. As the constant current output unit 2, which has received the off-control signal, turns off its output, the switch element 3 is turned off.

Step 3

By repeating Step 1 and Step 2, it is possible to discharge the energy with which the electrical storage element 4 is charged.

In this way, by using the switch element temperature detection unit 5 which detects the temperature of the switch element 3 and outputs the detected temperature of the switch element 3 to the control unit 1, the control unit 1 can reliably discharge the energy stored in the electrical storage element 4, while suppressing a temperature rise due to a loss of the switch element 3 to the limiting temperature of the switch element 3, regardless of variation in the on-voltage threshold value of the switch element 3 and in the switch element drive voltage.

Also, the input current Ig of the switch element 3 is limited, the on-time of the control signal is extended, and the time for which the current flowing through the switch element 3 rises (=the gate charge time t) is optionally determined, thus enabling discharge of the electrical storage element 4 using the control unit 1 with a low computing power.

Furthermore, the current information of the switch element 3 may be used for the on-time of the control signal of the control unit 1 of the first embodiment. The configuration in this case is the configuration shown in FIG. 4.

Figure 4:
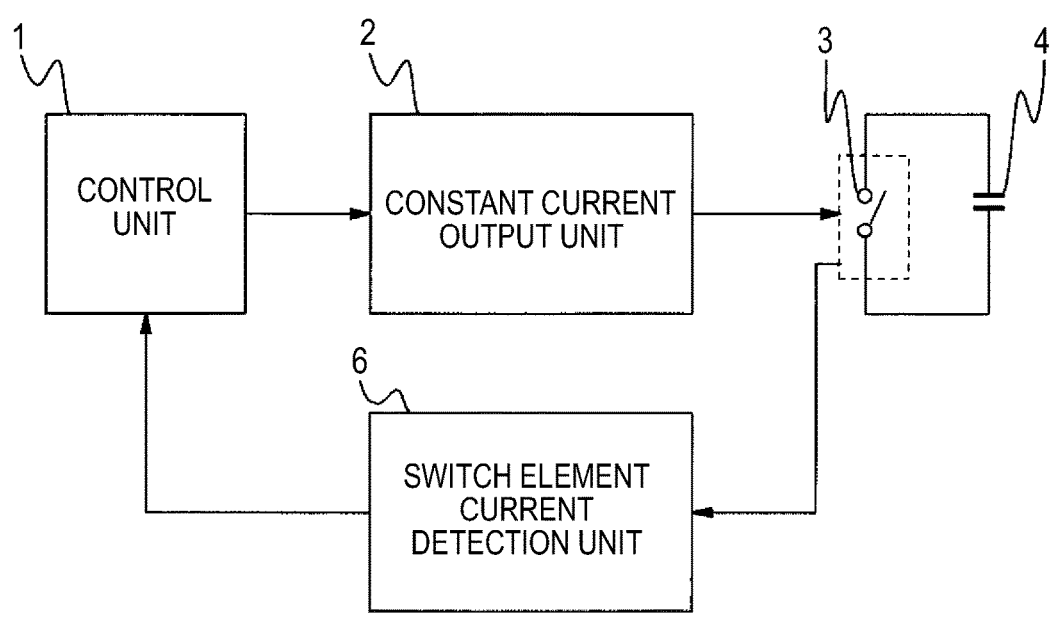
FIG. 4 is a circuit diagram illustrating another example of the discharge device according to the first embodiment of the invention.

FIG. 4 is a circuit diagram illustrating another example of the discharge device according to the first embodiment of the invention. The configuration shown in FIG. 4 is different, when compared with the previous configuration shown in FIG. 1, in further including a switch element current detection unit 6 which detects the current of the switch element 3 and outputs the detected current of the switch element 3 to the control unit 1. Thus, hereafter, a description will be given centered on an operation of the switch element current detection unit 6 which is the difference.

Step 1

The switch element current of the switch element 3 is detected by the switch element current detection unit 6.

Step 2

The control unit 1 determines whether or not the switch element current detected by the switch element current detection unit 6 is the limiting current Icmax of the switch element 3.

At this time, when the switch element current is not the limiting current of the switch element 3, the control unit 1 turns the control signal to on and outputs the on-control signal to the constant current output unit 2. When the switch element current is the limiting current of the switch element 3, the control unit 1 turns the control signal to off and output the off-control signal to the constant current output unit 2. As the constant current output unit 2, which has received the off-control signal, turns off its output, the switch element 3 is turned off.

Step 3

By repeating Step 1 and Step 2, it is possible to discharge the energy with which the electrical storage element 4 is charged.

In this way, by using the switch element temperature detection unit 6 which detects the current of the switch element 3 and outputs the detected current of the switch element 3 to the control unit 1, the control unit 1 can reliably discharge the energy stored in the electrical storage element 4, while suppressing a temperature rise due to a loss of the switch element 3 to the switch element limiting current at which the limiting temperature of the switch element 3 is reached, regardless of variation in the on-voltage threshold value of the switch element 3 and in the switch element drive voltage.

Second Embodiment

Figure 5:
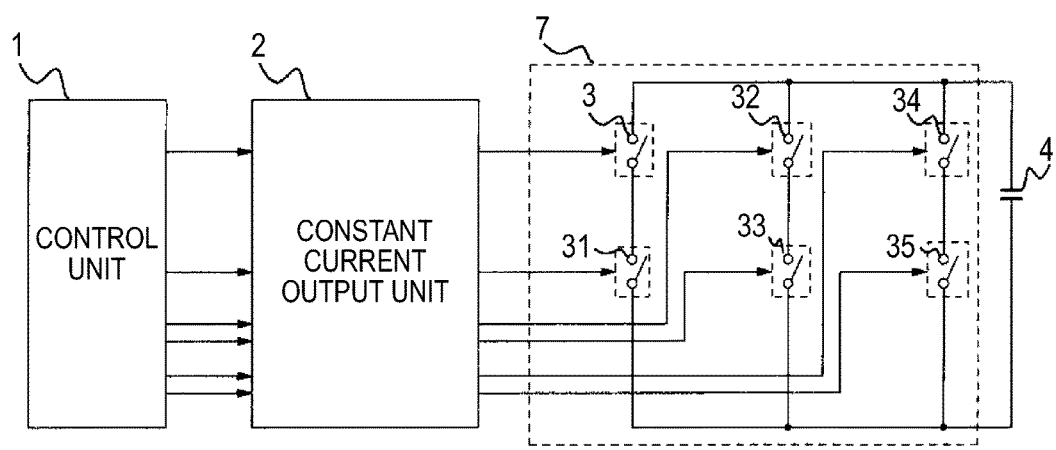
FIG. 5 is a circuit diagram illustrating an example of a discharge device according to a second embodiment of the invention.

Next, a description will be given of a second embodiment. FIG. 5 is a circuit diagram illustrating an example of a discharge device according to the second embodiment of the invention. The configuration shown in FIG. 5 is different, when compared with the previous configuration shown in FIG. 1 in the first embodiment, in that a switching section 7 including the switch element 3 is added.

The switching section 7 in the second embodiment is configured further including, in addition to the first switch element 3, a series body wherein a second switch element 31 is connected in series to the first switch element 3, a series body, formed of a third switch element 32 and fourth switch element 33, which is connected in parallel to the series body of the first switch element 3 and second switch element 31, and furthermore, a series body, formed of a fifth switch element 34 and sixth switch element 35, which is connected in parallel to the series body of the third switch element 32 and fourth switch element 33.

By implementing the same Step 1 to Step 3 as in the previous first embodiment on the first to sixth switch elements 3 and 31 to 35, it is possible to discharge the energy with which the electrical storage element 4 is charged.

Also, there is the advantageous effect that by using a plurality of switch elements, such as the first to sixth switch elements 3 and 31 to 35, the loss is dispersed, thus reducing heat generation per switch element.

The second embodiment shown here is the configuration of an inverter circuit. Consequently, the circuit configuration shown in FIG. 5 in the second embodiment represents that it is possible to carry out discharge without adding another circuit to the inverter circuit.

Also, in the previously described second embodiment, all the switch elements 3 and 31 to 35 are controlled on and off, but at least one switch element of at least one series body in the switching section 7 is turned on and off, while the remaining switch elements of the series bodies are always turned on, and the same Step 1 to Step 3 as in the first embodiment are implemented on the switch elements which are being turned on and off, thereby enabling the energy with which is charged the electrical storage element 4 to be discharged.

Consequently, as it is not necessary to operate the plurality of series bodies at the same time, it is also possible to control so that times for which the individual series bodies are short-circuited do not overlap with each other and thus disperse heat-generating places and the times.

Third Embodiment

Figure 6:
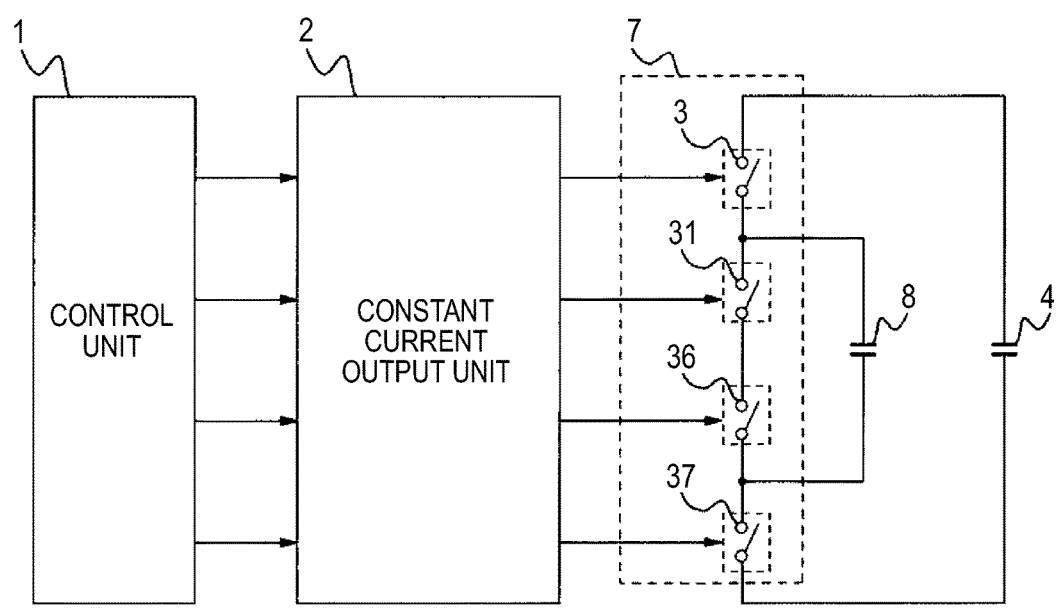
FIG. 6 is a circuit diagram illustrating an example of a discharge device according to a third embodiment of the invention.

Next, a description will be given of a third embodiment. FIG. 6 is a circuit diagram illustrating an example of a discharge device according to the third embodiment of the invention. The configuration shown in FIG. 6 is different, when compared with the configuration shown in FIG. 5 in the previous second embodiment, in that a second electrical storage element 8 to be discharged is added to the configuration of the switching section 7. Thus, hereafter, a description will be given centered on a configuration and operation of the switching section 7 and second electrical storage element 8 which are the differences.

The switching section 7 in the third embodiment is configured further including, in addition to the first switch element 3 and second switch element 31, a seventh switch element 36 and eighth switch element 37, wherein the four switch elements are connected in series in the order named. Furthermore, the second electrical storage element 8 is connected in parallel to the series circuit of the second switch element 31 and seventh switch element 36.

In the third embodiment, by implementing the same Step 1 to Step 3 as in the previous first embodiment on the first switch element 3, second switch element 31, seventh switch element 36, and eighth switch element 37, it is possible to discharge the energy with which is charged the electrical storage element 4 and the energy with which is charged the second electrical storage element 8.

The electrical storage element 4 and second electrical storage element 8 shown in FIG. 6 configure a multilevel chopper circuit by combining the first and second switch elements 3 and 31 and the seventh and eighth switch elements 36 and 37.

Consequently, according to the third embodiment of the invention, by using the circuit configuration shown in FIG. 6 according to the invention, it is possible to provide the discharging function of the invention without adding a circuit to the multilevel chopper circuit.

Also, in the previously described third embodiment, all the switch elements are controlled on and off, but at least one switch element, of the switch elements of the switching section 7, is turned on and off, while the remaining switch elements of the switching section 7 are always turned on, and the same Step 1 to Step 3 as in the first embodiment are implemented on the switch elements which are being turned on and off, thereby enabling the energy with which are charged the electrical storage element 4 and second electrical storage element 8 to be discharged.

As previously described, in the first embodiment to the third embodiment, there is also a case in which the current value input into the switch element 3 differs between during a normal control time and during a discharge control time. The control unit 1 can respond to this case by switching the control signal from a normal control signal to a discharge control signal and changing the current value output from the constant current output unit 2. The details will be described hereafter with the first embodiment as an example.

Figure 7:
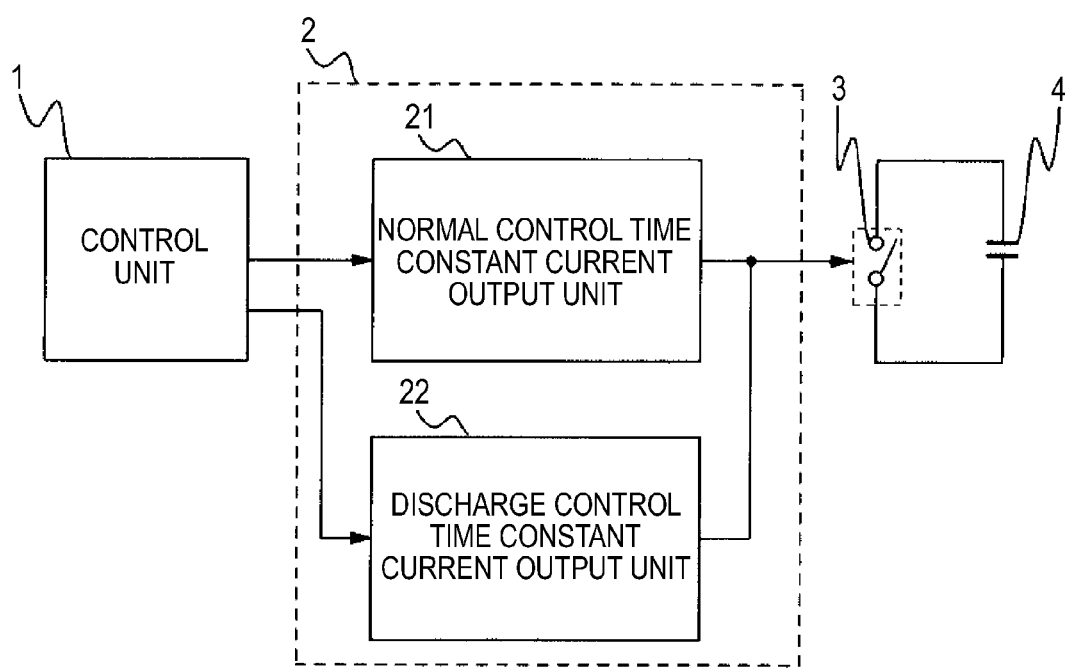
FIG. 7 is a circuit diagram illustrating another example of the discharge device according to the first embodiment of the invention.

FIG. 7 is a circuit diagram illustrating another example of the discharge device according to the first embodiment of the invention. The configuration shown in FIG. 7 is different, when compared with the previous configuration shown in FIG. 1, in that the constant current output unit 2 is configured of a normal control time constant current output unit 21 and discharge control time constant current output unit 22. Thus, hereafter, a description will be given centered on an operation of the constant current output unit 2 which is the difference.

The normal control time constant current output unit 21 is a circuit which, in normal control, outputs a preset current value to the drive terminal of the switch element 3, and the discharge control time constant current output unit 22 is configured in such a way as to output a current value such that a preset current rise time is reached during the discharge control time, and drive the switch element 3.

Herein, the normal control time indicates a condition in which the inverter circuit, the multilevel chopper circuit, or the like, is implementing a control to carry out a control other than discharge, and the discharge control time indicates a condition in which the inverter circuit, the multilevel chopper circuit, or the like, is implementing the first embodiment.

By implementing an optional control during the normal control time, and implementing the same steps as in the previous first embodiment during the discharge control time, it is possible to discharge the energy with which the electrical storage element 4 is charged.

In conclusion, in the invention, it is possible to freely combine the contents described in the first embodiment to the third embodiment or appropriately modify or omit any of the embodiments without departing from the scope of the invention.

Various modifications and alterations of this invention will be apparent to those skilled in the art without departing from the scope and spirit of this invention, and it should be understood that this is not limited to the illustrative embodiments set forth herein.

What is claimed is:

1. A discharge device, comprising:
    a switch element connected in parallel to an electrical storage element;
    a constant current output unit which supplies a constant current to the switch element; and
    a control unit which gives an on or off instruction to the constant current output unit, wherein
    the control unit controls the constant current output unit by setting an on-time of the switch element so as to cause energy with which is charged in the electrical storage element to be discharged through the switch element, the on-time being less than a limit time which is an energization time where an energization current of the switch element reaches a limiting current of the switch element, to thereby turn off the switch element in a region in which the energization current is lower than the limiting current.

2. The discharge device according to claim 1, comprising:
a switch element temperature detection unit which detects the temperature of the switch element and outputs the detected temperature information of the switch element to the control unit, wherein
the control unit, based on the temperature condition of the switch element, controls the on-time of the switch element.

3. The discharge device according to claim 1, comprising:
a switch element current detection unit which detects the current of the switch element and outputs the detected current information of the switch element to the control unit, wherein
the control unit, based on the current condition of the switch element, controls the on-time of the switch element.

4. The discharge device according to claim 1, wherein
there are a plurality of the switch elements, and the plurality of switch elements configure a switching section, and wherein
the electrical storage element and the switching section are connected in parallel.

5. The discharge device according to claim 4, wherein
the control unit controls on and off of at least one of the plurality of switch elements, and controls on of another switch element.

6. The discharge device according to claim 4, wherein
the control unit controls on and off of all the plurality of switch elements.

7. The discharge device according to claim 6, wherein
the control unit controls so that a time for which the switch element turns off does not overlap a time for which another switch element turns off.

8. The discharge device according to claim 4, wherein
the switching section is configured of a series body wherein other switch elements are connected in series to the switch element.

9. The discharge device according to claim 8, wherein
the switching section is configured by connecting a plurality of the series bodies in parallel.

10. The discharge device according to claim 4, wherein
the switching section is configured of a parallel body wherein other switch elements are connected in parallel to the switch element.

11. The discharge device according to claim 4, wherein
the switching section has a configuration wherein a first switch element, a second switch element, a third switch element, and a fourth switch element are connected in series,
the electrical storage element is connected across the switching section so as to be in parallel with the switching section, and
a second electrical storage element is connected across a series body of the second switch element and third switch element so as to be in parallel with the series body of the second switch element and third switch element.

12. The discharge device according to claim 1, wherein
the constant current output unit control time to the switch element.

13. The discharge device according to claim 1, wherein
a discharge resistor is connected in parallel to the electrical storage element, and discharge is carried out in combination with the discharge resistor when discharging the electrical storage element.

* * * * *